United States Patent
Suzuki et al.

Patent Number: 5,393,565
Date of Patent: Feb. 28, 1995

[54] METHOD FOR DEPOSITION OF A REFRACTORY METAL NITRIDE AND METHOD FOR FORMATION OF A CONDUCTIVE FILM CONTAINING A REFRACTORY METAL NITRIDE

[75] Inventors: Toshiya Suzuki; Takayuki Ohba, both of Kawasaki; Shimpei Jinnouchi; Seishi Murakami, both of Tokyo, all of Japan

[73] Assignee: Fujitsu Limited, Kawasaki, Japan

[21] Appl. No.: 72,086

[22] Filed: Jun. 7, 1993

[30] Foreign Application Priority Data

Jun. 8, 1992 [JP] Japan ................... 4-147656

[51] Int. Cl.$^6$ ............................ C23C 16/00
[52] U.S. Cl. .................. 427/255.2; 427/255; 427/255.1; 427/255.7; 427/248.1; 427/126.1; 427/404; 437/200
[58] Field of Search ............ 427/255.2, 255.1, 255.7, 427/255, 248.1, 126.1, 404; 437/200

[56] References Cited

U.S. PATENT DOCUMENTS

| | | | |
|---|---|---|---|
| 5,104,694 | 4/1992 | Saito et al. | 427/255.2 |
| 5,139,825 | 8/1992 | Gordon et al. | 427/255.2 |
| 5,196,360 | 3/1993 | Doan et al. | 437/41 |

OTHER PUBLICATIONS

M. J. Buiting, et al., "Kinetical Aspects of the LPCVD of Titanium Nitride From Titanium Tetrachlorids and Ammonia", J. Electrochem, Soc., vol. 138, No. 2, pp. 500-505, Feb. 1991.

I. J. Raaijmakers, et al., "Contact Hole Fill With Low Temperature LPCVD TiN", Proceedings of the 7th International IEEE VLSI, Jun. 1990, Santa Clara, Calif. p. 1-7.

E. O. Travis, et al. "A Scalable Submicron Contact Technology Using Conformal LPCVD TiN", IEEE IEDM Tech. Dig., 47, pp. 1-4, 1990.

T. Akahori, et al. "Preparation of TiN Films by ECR Plasma CVD", Extended Abstracts of the 1991 International Conference on Solid State Devices and Materials, pp. 180-182, 1991.

I. J. Raajimakers, et al. "Conformal Deposition of TiN At Low Temperatures By Metal Organic CVD" VMIC Conference, pp. 260-266, Jun. 1992.

K. Ishihara, et al. "Characterization of CVD-TiN Films Prepared With Metalorgnic Source", Japanese Journal of Applied Physics, vol. 29, No. 10, pp. 2103-2105, Oct. 1990.

K. Ikeda, et al., "Photo Assisted LPCVD TiN For Deep Submicron Contracts Using Organo-titanium Compound", 1990 Symposium on VLSI Technology, pp. 61-62.

C. Y. Ting, et al. "The Use Of Titanium-Based Contact Barrier Layers In Silicon Technology", Thin Solid Films, 96 pp. 327-345, 1982.

*Primary Examiner*—Roy V. King
*Attorney, Agent, or Firm*—Staas & Halsey

[57] ABSTRACT

A refractory metal nitride is deposited at a temperature of 600° C. according to a chemical vapor phase deposition method by using a source gas containing a refractory metallic element and a reduction gas containing one of an alkyl amino compound, alkyl azide compound, hydrazine and a hydrazine alkyl compound for reducing the source gas. This refractory metal nitride is used as a barrier metal material for interconnection in a semiconductor device. When forming a refractory metal nitride as a barrier metal on a silicon layer or forming a contact metal between the barrier metal and the silicon layer, a natural oxide film on the surface of the silicon layer set in a pressure-reduced atmosphere is removed by reducing with hydrazine or a hydrazine alkyl compound.

14 Claims, 11 Drawing Sheets

METHOD FOR DEPOSITION OF A REFRACTORY METAL NITRIDE AND METHOD FOR FORMATION OF A CONDUCTIVE FILM CONTAINING A REFRACTORY METAL NITRIDE

BACKGROUND OF THE INVENTION

1. Field of the Invention

The present invention relates to a method for deposition of a refractory metal nitride such as titanium nitride, tungsten nitride and molybdenum nitride which are used for preventing diffusion of an interconnection material such as Al or W into a semiconductor layer and as a preventive film for interconnection and, more particularly, to a method for forming a conductive film having a layer of such refractory metal nitride.

Lately, it has been demanded to implement fabrication of semiconductor devices of higher density integration as well as provision of a thinner diffusion layer in semiconductor substrates and multilevel interconnection. Therefore, a barrier metal made of a refractory metal nitride has been used as a base layer or a surface layer of an electrode to prevent intrusion of an electrode metal into the diffusion layer and formation of hillocks on the electrodes and improve adhesion of the electrodes.

2. Description of the Related Art

For forming a barrier metal which serves as a base of a interconnection layer, a Thermal Chemical Vapor Deposition (hereafter referred to as the "thermal CVD") method using halide gas and ammonia gas is widely examined.

For depositing titanium nitride, which will serve as a barrier metal, by the thermal CVD method using, for example, titanium chloride (TiCl4) and ammonia (NH3) are used as a reactive gas, the deposition temperature at which a satisfactory step coverage is obtained is 650° C. or over. In this case, chlorine remaining in the barrier metal is a cause of high resistance and a deposition temperature higher than 600° C. is required to remove chlorine. The details of the above description are disclosed, for example, in the following three documents.

[1] M. J. Buiting, A. F. Otterloo, and A. H. Montree, J. Electrochem. Soc., Vol. 138, No.2, Feb. 1991,

[2] Ivo J. Raaijmakers and Artbur Sherman, Proceedings of the 7th international IEEE V.M.I.C. Santa Clara, June 1990,

[3] E. O. Travis, W. M. Paulson, F. Pintchovski, B. Boeck, L. C. Parillo, M. L. Kottke, K. Y. Yu, M. J. Rice, J. B. Price, and E. C. Eichman, IEEE IEDM Tech. Dig., 47(1990).

A reaction as given below may be caused with TiCl4 and NH3 even at room temperature.

TiCl4+NH3→[TiCl4]n[NH3] (It was described in [1].)

Moreover, at high temperature, the following reaction is occured.

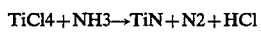

Both NH4Cl and [TiCl4]n[NH3] remain solid at room temperature and, when they deposit on an internal wall of a chamber, they may be a cause of particles. The internal wall of the chamber of the CVD apparatus should be heated to 120° C. or over to sublimate these particulates. However, if a chamber heating mechanism is provided, the CVD apparatus will be required to be large-sized and power consumption will also increase.

On the other hand, another method is available which uses TiCl4 and N2 as reaction gases and deposits titanium nitride by an Electron Cyclotron Resonance (ECR)—CVD method. In this case, the deposition temperature is raised high. This method of deposition is reported in the document shown below.

[4] Takashi Akahori and Akira Tanihara, Extended Abstracts of the 1991 International Conference on Solid-State Devices and Materials.

However, if a barrier metal consisting of titanium nitride is deposited at such high temperature as described above, there may be caused a melting and hillock of aluminium.

A further another method is also available which allows deposition of titanium nitride at a deposition temperature of 450° C. or under by the thermal CVD method or the photo-assisted CVD method using an organic titanium source. However, a barrier metal made of titanium nitride obtained by this method is inferior in the step coverage and has a high resistance. This is disclosed in the following document.

[5] Ivo J. Raaijmakers, Raymond N. Vrtis, G. S. Sandhu, J. Yang, E. K. Broadbent, D. A. Toberts, and A. Lagendijk, Jun. 9-10, 1992 VMIC Conference.

[6] Kazuya Ishihara, Katsumi Yamazaki, Hideonao Hamada, Koichi Kamisaka and Yasuo Tarui, Japanese Journal of Applied Physics Vol. 29, No.10, Oct. 1990.

[7] Koichi Ikeda, Masahiko Maeda and Yoshinobu Arita, 1990 Symposium on VLSI Technology.

It is known that, when a barrier metal consisting of a refractory metal is directly formed on a semiconductor substrate (or silicon wafer), satisfactory contact between the barrier metal and the semiconductor substrate [8] is not obtained and a contact metal for reducing a contact resistance should be interposed therebetween. After forming the contact metal such as Ti or Al, a natural oxide film should be removed.

[8] C. Y. Ting and M. Wittmer, Thin Solid Films, 96(1982)327-345 Electronics and Optics.

Currently, a contact metal is formed using a sputtering apparatus after the natural oxide film has been removed with a mixed solution of hydrofluoric acid and pure water, then a barrier metal is formed by using the CVD apparatus. Thus, a semiconductor wafer is exposed to the air in each of different processes and the substrate is moved. Since there is unavailable a technology for carrying out the series of these processes without cancelling a vacuum condition, a natural oxide film is not completely removed during formation of the contact metal and faulty contact is prone to occur.

SUMMARY OF THE INVENTION

An object of the present invention is to provide a method for deposition of a refractory metal nitride suitable for deposition at a lower temperature.

Another object of the present invention is to provide a method for deposition of a refractory metal nitride capable of preventing a product, which remains solid at room temperature, on an internal wall of a chamber for deposition of a refractory nitride.

Another further object of the present invention is to provide a method for deposition of a conductive film such as a contact metal and a barrier metal on a surface of a silicon layer without causing regrowth of a natural oxide film on the surface of the silicon layer.

The present invention made with a key importance on alkyl amino compound, alkyl azide compound, hydrazine and hydrazine alkyl compound which provides an extremely high reduction capacity enables to deposit a refractory metal nitride produced by means of a chemical vapor phase growth at a lower temperature by using a gas containing such compound as a reducing and nitrogenizing agent for a source gas containing a refractory metallic element. For example, the deposition temperature can be set to approximately 300° C.–500° C.

A halogen content concentration and also a resistivity of a refractory metal nitride produced through a reaction of such gas become smaller by one digit than those in the case that NH3 as a reduction gas, and its step coverage is satisfactory. In this reaction, such substance as remains solid at room temperature is not produced and a quantity of solids which deposit on the internal wall of the chamber is substantially reduced.

According to another aspect of the present invention, a natural oxide film which resides on a silicon layer is removed with hydrazine gas or alkyl compound gas of hydrazine as a pretreatment before forming a contact metal or a barrier metal on the silicon layer. This gas is used as a reduction gas in deposition of the contact metal or the barrier metal and therefore the contact metal or the barrier metal can be deposited by simply changing over the gas to be used without cancelling the vacuum condition after the natural oxide film has been removed, the throughput is improved and the regrowth of the natural oxide film is prevented.

The refractory metal nitride can be used not only as a barrier metal, but also as a contact-burying metal, because of its good step coverage.

DESCRIPTION OF THE PREFERRED EMBODIMENTS

(1) First Embodiment

Figure 1:
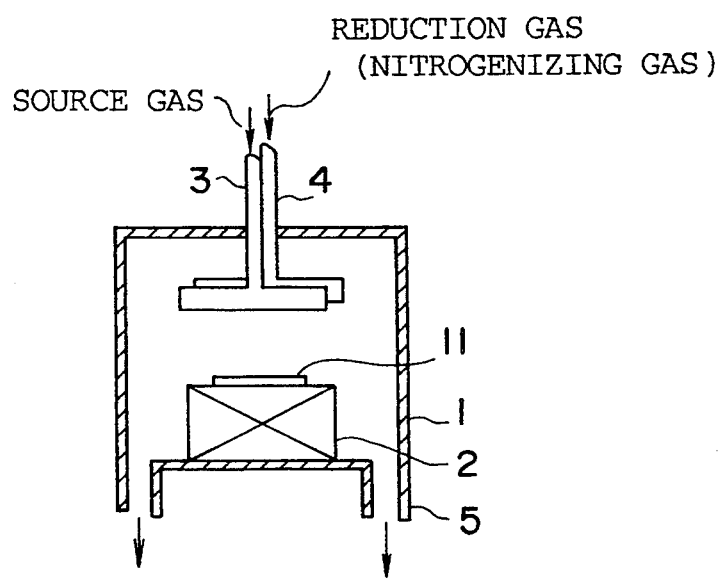
FIG. 1 is a general configuration of a thermal CVD apparatus to be used in an embodiment of the present invention.

Referring to FIG. 1, there is shown a general configuration of a thermal chemical vapor deposition (hereafter referred to as the "thermal CVD") to be used for deposition of a barrier metal in accordance with the first embodiment of the present invention.

This thermal CVD apparatus comprises a chamber 1 for depositing a film, a stand 2 incorporating a heater for resting a semiconductor substrate (to be also identified as a semiconductor wafer), a first gas inlet 3 for introducing a source gas into the chamber 1, a second gas inlet 4 for introducing a reduction gas into the chamber 1, and a gas outlet 5 which is connected to an gas discharging mechanism 5, not shown, for discharging a gas from the chamber 1.

The following describes the processes for forming a titanium nitride film as a barrier metal on a semiconductor substrate by means of the thermal CVD apparatus, referring to FIG. 2(A)–FIG. 2(G).

Prior to the description of deposition of the barrier metal, a semiconductor substrate before the barrier metal is formed thereon and a stacking structure thereof are described.

Figure 2A:
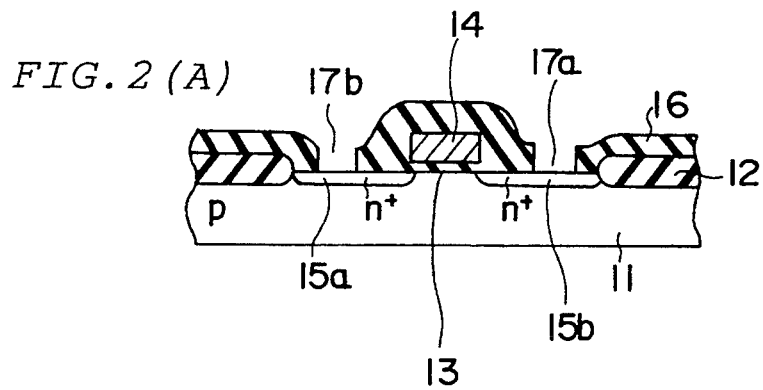
FIGS. 2(A), 2(B), 2(C), 2(D), 2(E), 2(F) and 2(G) are respectively a cross sectional view showing variation modes of a stacking structure of a semiconductor device where a barrier metal according to the first to third embodiments of the present invention is formed.
Figure 2B:
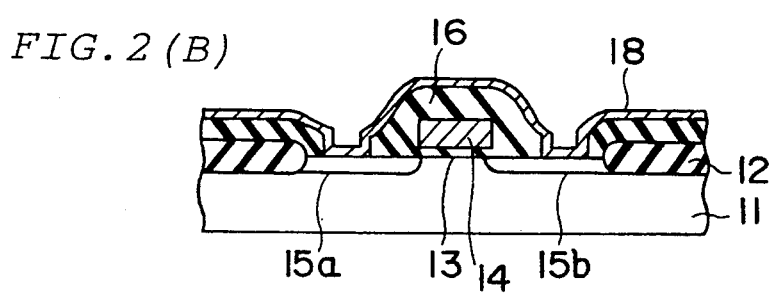

FIG. 2(A) is a cross sectional view showing a state of an interlevel insulator covering a MOSFET where contact holes are formed.

A field oxide film 12 consisting of SiO2 is formed in a thickness of 6000Å on a semiconductor substrate 11 made of a p type silicon by selective thermal oxidation. A MOSFET is formed in an area surrounded by the field oxide film 12. The MOSFET is provided with a gate insulation film 13 having a thickness of approximately 100Å which is made of SiO2 formed by thermal oxidation on the surface of semiconductor substrate 11, a gate electrode 14 consisting of a polysilicon film having a thickness of approximately 2000Å deposited by the CVD method and n+ type S/D area layers 15a and 15b which are formed on the semiconductor substrates 11 at both sides of the gate electrode 14 by an ion implantation method.

These S/D area layers 15a and 15b are formed by implanting, for example, arsenic (As) into the semiconductor substrate 11 in a dose of $4 \times 10^{15}/cm^2$ and with an acceleration energy of 30 KeV and activating the areas at 850° C.

The gate electrode 14, S/D area layers 15a and 15b and the field oxide film 12 are covered with the interlevel insulator 16 having the thickness of 5000Å which consists of a silicon oxide film. Contact holes 17a and 17b are formed on S/D area layers 15a and 15b.

The semiconductor substrate 11 on which such MOSFET as described above is formed is set on the stand 2 of the CVD apparatus and heated by a heater provided inside the stand 2 to a temperature less than 600° C., preferably to 300° C.–500° C., then kept under this condition. A gas in the chamber 1 is discharged through the gas outlet 5 to reduce the internal pressure.

A N2 gas is let to flow at a flow rate of 10 sccm as a carrier gas into a Ti(N(CH3)2)4 solution which is an alkyl amino compound of titanium while being bubbled and a mixed gas of Ti(N(CH3)2)4 and N2 thus obtained is introduced as a source gas into the chamber 1 through the first gas inlet 3. At this time, a partial pressure of the source gas is approximately 40 mTorr and the partial pressure of Ti(N(CH3)2)4 accounts for approximately 10 mTorr.

Dimethyl hydrazine ((CH3)2NNH2) gas is introduced as a reductant and nitrogenizing agent at a flow rate of 10-100 sccm through the second gas inlet 4. (CH3)2NNH2 has a vapor pressure of approximately 150 Torr at room temperature (25° C.) and therefore it is directly supplied by using the MFC (Mass Flow Controller).

In case of introduction of such gas, the internal pressure of the chamber 1 is maintained at several tens mTorr-1 Torr by adjusting a volume of gas to be discharged.

A carrier gas such as H2 can be introduced at a flow rate of approximately 10-1000 sccm. Though this introduction of gas will support the reduction, it is not always required.

Under the condition as described above, in the chamber 1, (CH3)2NNH2 is activated by a heating temperature and reacts with Ti(N(CH3)2)4 and TiN, methane(CH4) and hydrogen(H2) are produced. Thus titanium nitride as a reactive product is deposited along the upper surfaces of S/D area layers 15a and 15b, internal peripheries of contact holes 17a and 17b and the upper surface of the interlevel insulator 16 and CH4 and H2 which become a gas at room temperature are discharged through the gas outlet 25.

The semiconductor substrate 11 is kept in this state for a specified period of time and, as shown in FIG. 2 (B), a titanium nitride film 18, a refractory metal nitride, is formed in a thickness of approximately 400Å.

Figure 2C:
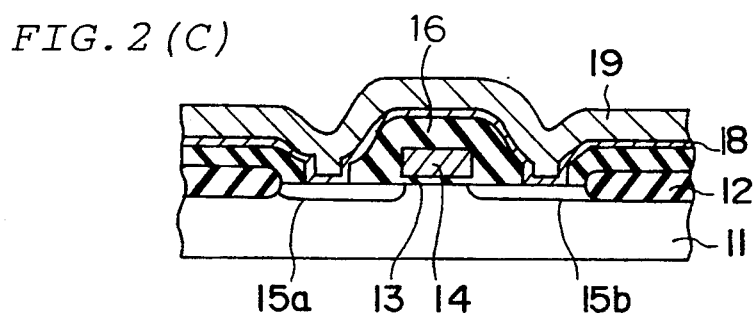
Figure 2D:
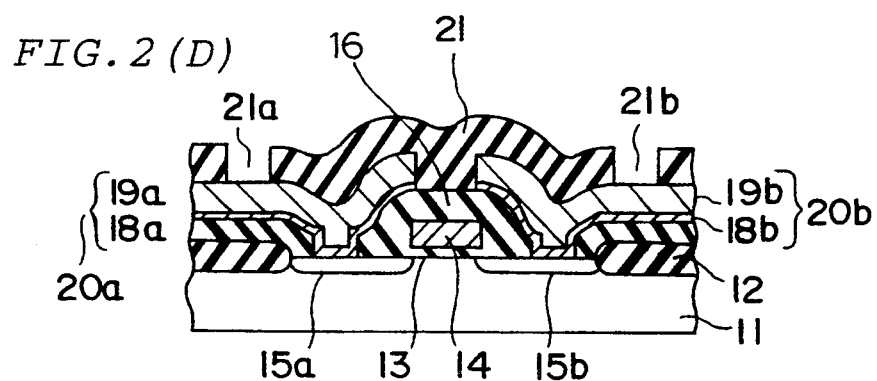
Figure 2E:
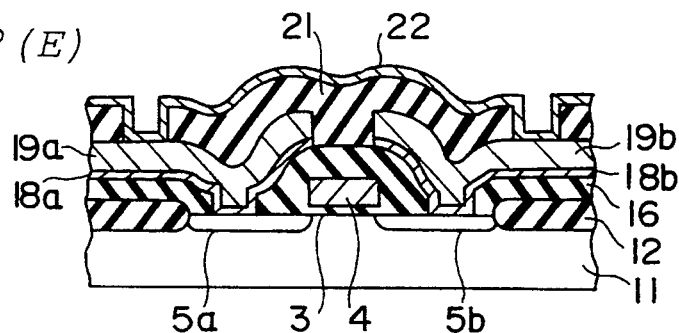
Figure 2F:
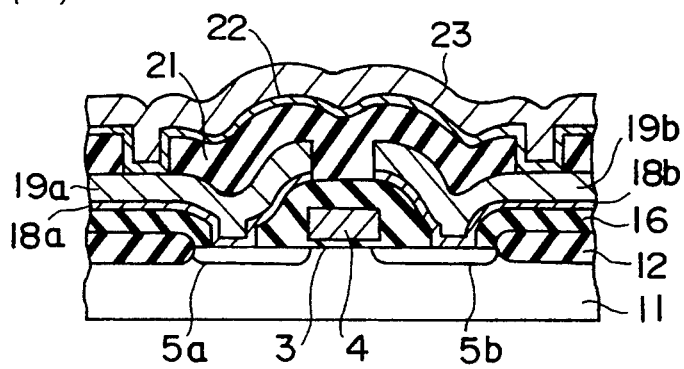
Figure 2G:
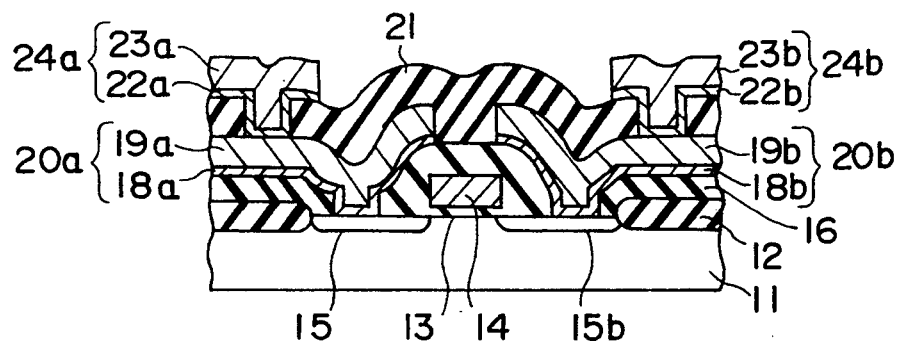

Then, as shown in FIG. 2(C), an aluminium film is deposited in a thickness of approximately 5000Å on the titanium nitride film 18 by the PVD method such as a sputter. Subsequently, this two-layer film consisting of the titanium nitride film 18 and the aluminium film 19 is patterned with the same mask and S/D electrodes 20a and 20b led out from S/D area layers 15a and 15b are formed.

Then, as shown in FIG. 2 (D), viaholes 21a and 21b are formed on S/D electrodes 20a and 20b after an interlevel insulator 21 such as PSG has been formed.

Then, as shown in FIGS. 2 (E) and (F), a two-layer film consisting of a titanium nitride film 22 having a thickness of approximately 400Å and an aluminium film 23 having a thickness of approximately 5000Å by a similar method to formation of the above described titanium nitride film 18 and the aluminium film 19.

Subsequently, as shown in FIG. 2 (G), the titanium nitride film 22 and the aluminium film 23 are patterned by a lithography technology to form aluminium interconnection layers 24a and 24b to be connected to S/D electrodes 20a and 20b. After this, a semiconductor device is completed by forming a interconnection pad, protective insulation film and others though not shown.

As described above, in the first embodiment of the present invention, the titanium nitride film 18 is formed on the substrate according to the CVD method by using Ti(N(CH3)2)4 which is an alkyl amino compound of titanium as a source gas containing a refractory metallic element and a reduction agent for the source gas containing (CH3)2NNH2 gas which is an alkyl amino compound. This reduction gas takes also effect as nitrogenizing gas.

In this case, in addition to titanium nitride, only CH4 gas and H2 gas which remain gaseous at room temperature are produced as reactive products and a substance as NH4Cl which remains solid at room temperature is not produced as in case of the prior art which uses a mixed gas of TiCl4 and NH3. Since CH4 gas and H2 gas are discharged from the gas outlet 5 of the chamber 1, deposition of reactive products on the internal wall of the chamber 1 is restricted and a heater or the like for sublimating those reactive products need not be added to the CVD apparatus.

Thermal activation is enabled at approximately 300° C. by using the source gas and the reduction gas as described above and the film forming temperature can be substantially lowered from the conventional level which have been required to be 600° C. or over. Therefore S/D electrodes 20a and 20b and interconnections 24a and 24b do not melt and its hillocks are difficult to occur.

In the above description, Ti (N(CH3)2)4 which is an alkyl amino compound of titanium is used as a source gas but it can be Ti (N(C2H5)2)4. As other source gases containing titanium can be used a gas containing alkoxides such as Ti(i-OC3H7)4 and Ti(t-OC4H9)4 or halides such as TICl4, TiCl3, TiCl2 and TiF4, or a gas containing cyclopentadienyl compounds such as Cp2Ti(N3)2 and Cp2Ti. However, cyclopentadienyl compounds Cp2Ti(N3)2 and Cp2Ti which usually remain solid at a room temperature are sublimated and gasified at approximately 200° C.

In these chemical formulae, "i" denotes "iso" and "t" denotes "tertial". "Cp" denotes "cyclopentadienyl radical" as an abbreviation of "C5H5".

In addition, the reduction gas can contain alkyl amino compounds such as CH3NH2, (CH3)2NH, (CH3)3N, (C2H5)2NH, (C2H5)3N, CH3NHNH2 and C6H5NHNH2 in addition to (CH3)2NNH2 and (CH3)HNNH2. Furthermore a gas containing hydrazine (N2H4), a gas containing a hydrazine alkyl compound or Alkyl azide compound can be used. Hydrazine alkyl compounds are (CH3)HNNH2 and (CH3)2NNH2. Alkyl azide compound are (CH3)N3 and (C2H5)3.

In this embodiment, titanium nitride is used as a barrier metal but other nitrides such as tungsten (W) and molybdenum (Mo) can be used (similarly applicable to other embodiments). In this case, the source gas contains an alkyl amino compound, alkoxide, halide or cyclopentadienyl compound of a refractory metal.

The following describes the deposition rate, resistivity, chlorine concentration and step coverage of the titanium nitride film in the case that TiCl4 is used as the source gas and methyl hydrazine ((CH3)HNNH2; hereafter referred to as "MH") is used instead of (CH3)2NNH2 as the reduction gas. Experimentally, the pressure in the chamber was set to 100 mTorr and titanium nitride was deposited in the temperature range of 400°-700° C.

Figure 3:
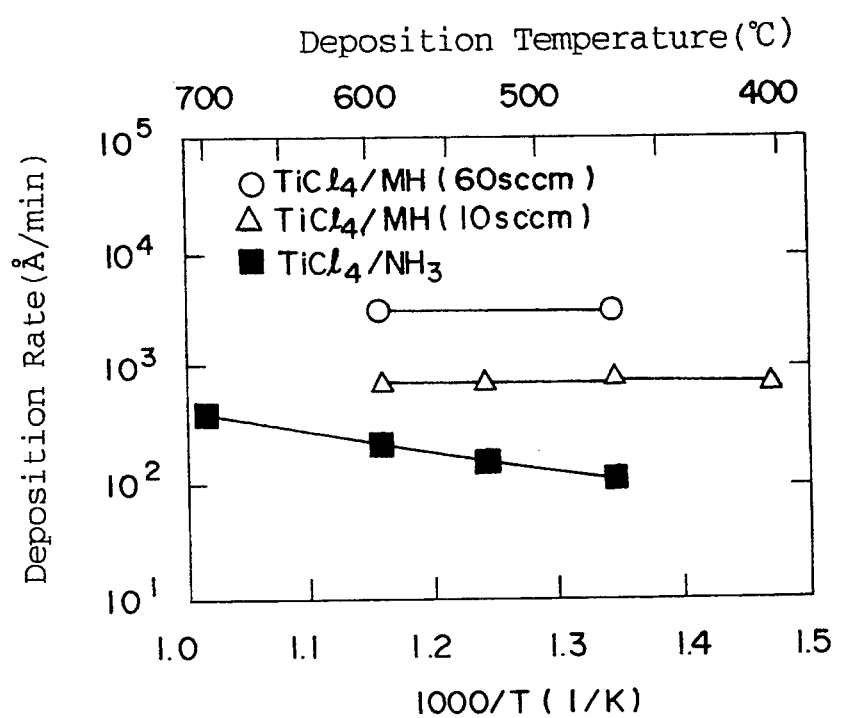
FIG. 3 is a comparison diagram showing the deposition rates of a titanium nitride film deposited by a method specified by the first embodiment of the present invention and a titanium nitride film deposited by a conventional method.

FIG. 3 shows the deposition rates when MH and NH3 were respectively used as the reduction agent.

The deposition rate of the TiN film by MH reduction is larger by one digit than that in NH3 reduction and the deposition rate of 800Å/min was obtained when the MH flow rate is 10 sccm and the deposition temperature is 400° C. This indicates that the reactivity in MH reduction is extremely high as compared with NH3 reduction.

In addition, from the X-ray diffraction of the crystal structure of titanium nitride obtained by MH reduction, it is known that typical NaCl type titanium nitride crystals have grown and have been preferentially oriented to (200) plane and the grain size of crystals are 200–260Å. It is also recognized that titanium nitride has been deposited on an silicon oxide (SiO2) film in MH reduction and its crystals have been preferentially oriented to (200) plane.

However, the TiN film deposited on PVD-Ti layer was preferred to (111) plane.

Figure 4:
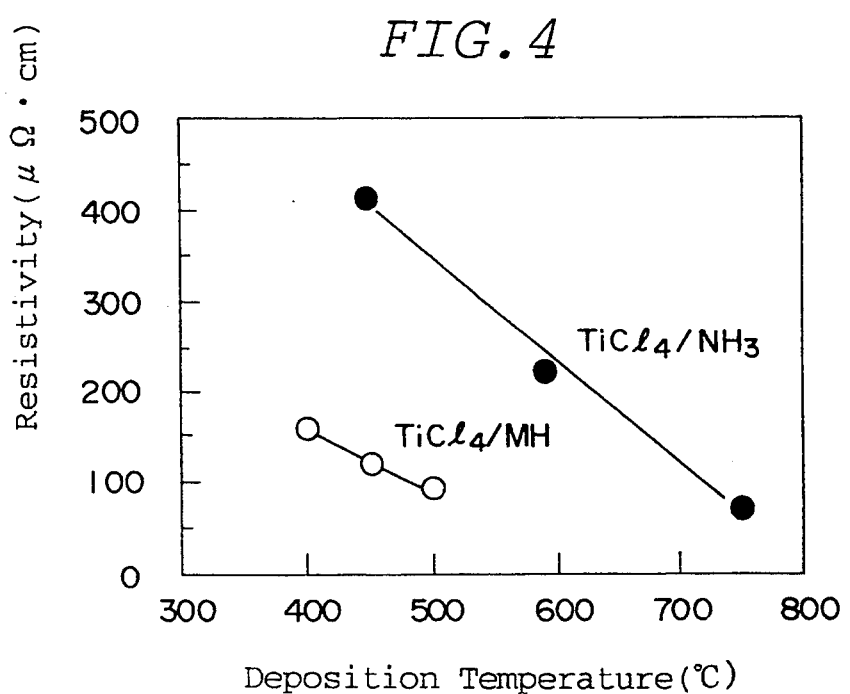
FIG. 4 is a comparison diagram showing the resistivities of a titanium nitride film deposited by a method specified by the first embodiment of the present invention and a titanium nitride film deposited by a conventional method.

FIG. 4 shows the relationship between the resistivity and the deposition temperature. The resistivity decreased as the deposition temperature increased and titanium nitride deposited by MH reduction showed the resistivity of 90 $\mu\Omega$.cm at 500° C. A higher deposition temperature of 700° C. is required to obtain an equivalent resistivity in NH3 reduction.

Figure 5:
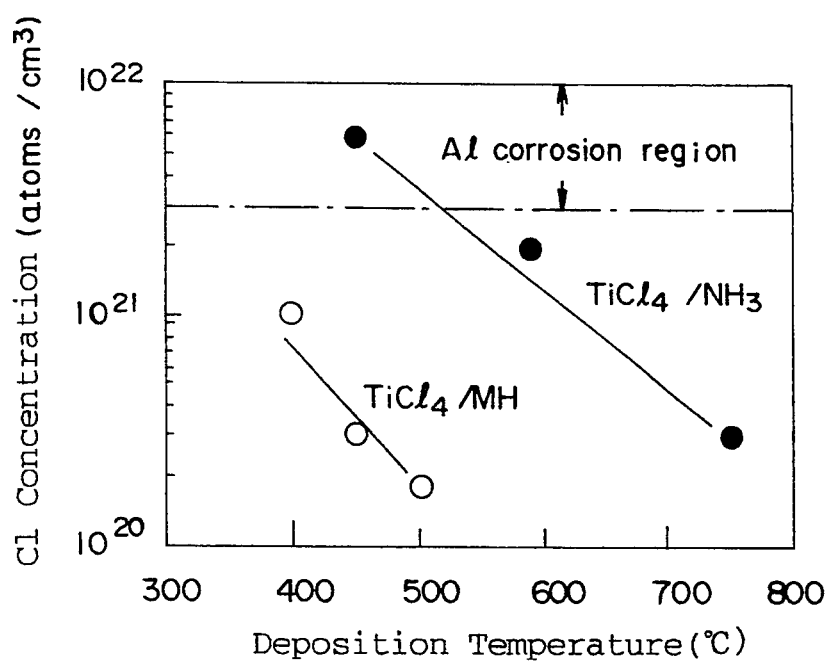
FIG. 5 is a comparison diagram showing the chlorine content concentrations of a titanium nitride film deposited by a method specified by the first embodiment of the present invention and a titanium nitride film deposited by a conventional method.

FIG. 5 shows the relationship between the chlorine concentration in the titanium nitride film and the deposition temperature. While the chlorine concentration of titanium nitride obtained in deposition by NH3 reduction is 3.3 atomic % at the deposition temperature of 500° C., that of titanium nitride by MH reduction is 0.18 atomic % at the same deposition temperature.

This clarifies that the MH gas can satisfactorily reduce TiCl4 and also reduces the residual chlorine concentration. Accordingly, it is assumed that the chlorine concentration decreases as the deposition temperature rises and the resistivity reduces as the residual chlorine concentration decreases in view of the results shown in FIG. 4.

The decreasing of chlorine concentration redudes corrosion of aluminium formed thereon. Corrosion is observed after cleaning with water. In a microscopic observation after the titanium nitride film has been deposited by MH reduction, an aluminium film has been stacked thereon and the substrate has been cleaned with water, no corrosion was observed on the surface of the aluminium film. On the other hand, in case of NH3 reduction, the deposition temperature should be 550° C. or over to reduce the chlorine content.

Corrosion of aluminium when the titanium nitride film is formed by reducing the source gas with NH3 occurs at the interface of the interlevel insulator and the aluminium film. It is presumed that the corrosion is caused due to diffusion of chlorine contained in the titanium nitride film into water which has penetrated into the interface during cleaning with water.

As regards the step coverage, it is clarified that, when titanium nitride produced by MH reduction is deposited in a thickness of 1700Å, contact holes with diameter of 0.2 $\mu$m$\Phi$ and aspect ratio of approximately 2.6 have been completely plugged up and therefore the step coverage is satisfactory. It is also confirmed that the leak current is as large as that in the conventional case.

Titanium nitride can be used not only as a barrier metal, but also as a contact-burying metal, because of its good step coverage.

(2) Second Embodiment

Figure 6:
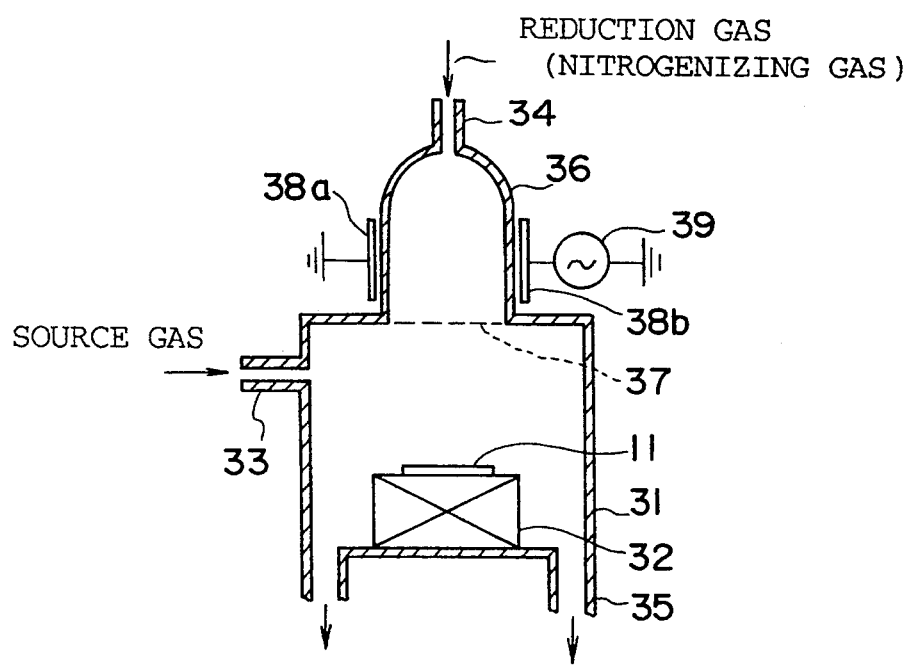
FIG. 6 is a general configuration of a plasma CVD apparatus to be used in an embodiment of the present invention.

FIG. 6 is a general configuration of the CVD apparatus for forming a refractory metal nitride in accordance with the second embodiment of the present invention.

FIG. 6 differs from FIG. 1 in that means for applying a high frequency voltage to the parallel plate electrodes is provided as means for activating the reduction gas.

The reaction chamber 31 of the CVD apparatus is internally provided with a stand 32 for resting a semiconductor substrate, a gas inlet 33 for introducing the source gas into the reaction chamber 31 and a gas outlet 35 connected to the gas discharger which is not shown.

A plasma chamber 36 is mounted on the reaction chamber 31 and their internal spaces are partitioned by a mesh type trap 37 which prevents from intruding of ion produced by plasma into the reaction chamber 31.

In addition, the plasma chamber 36 is provided with a gas inlet 34 for introducing the reduction gas and a pair of electrodes 38a and 38b are arranged on the outer periphery of the plasma chamber so that the reduction gas in the plasma chamber 36 is activated by applying a field across the electrodes. A high frequency power supply 39 for supplying a high frequency voltage of 13.46 MHz is connected to one electrode 38b and the other electrode 38a is grounded.

The reduction gas introduced into the plasma chamber 36 is activated by applying a high frequency voltage across two electrodes 38a and 38b. In this case, the reduction gas is activated with a plasma and therefore the substrate heating temperature of 500° C. or under by the heater built in the stand 31 is sufficient for deposition.

In the CVD apparatus as described above, a gas containing an alkyl amino compound, alkoxide, halide or cyclopentadienyl compound of a refractory metal is used as a source gas containing a refractory metallic element and a gas containing an alkyl amino compound, a gas containing an alkyl azide compound or a gas containing a hydrazine or a hydrazine alkyl compound is used as the reduction agent for reducing the source gas as in the first embodiment of the present invention. This reduction gas takes also effect as nitrogenizing gas.

Titanium nitride which is a refractory metal nitride and alkyl compounds, N2 and H2 which are gaseous at room temperature are produced from the reaction of the source gas and the reduction gas. Theses gases are discharged from the gas outlet 35 of the reaction chamber and do not remain on the internal wall of the reaction chamber 31. The titanium nitride film is formed and used as a barrier metal for the interconnection on the semiconductor substrate as in FIG. 2 (A)–FIG. 2 (G).

In this embodiment, the above described source gas and reduction gas are used and the reductive gas is activated by a field of high frequency voltage. Accordingly, a substrate heating temperature of 300° C.–500° C. is sufficient to obtain the titanium nitride film and, in case of a interconnection layer being provided below the electrode, a thermal effect on the lower interconnection layer is further reduced and electrode hillock is also restrained.

In addition, it is known from the comparison of reduction using NH3 as the reduction agent for the source gas and reduction using the reduction agent specified in this embodiment that the deposition rate is large, the resistivity is small, the chlorine concentration is low and the step coverage is satisfactory in the latter reduction.

(3) Third Embodiment

Figure 7:
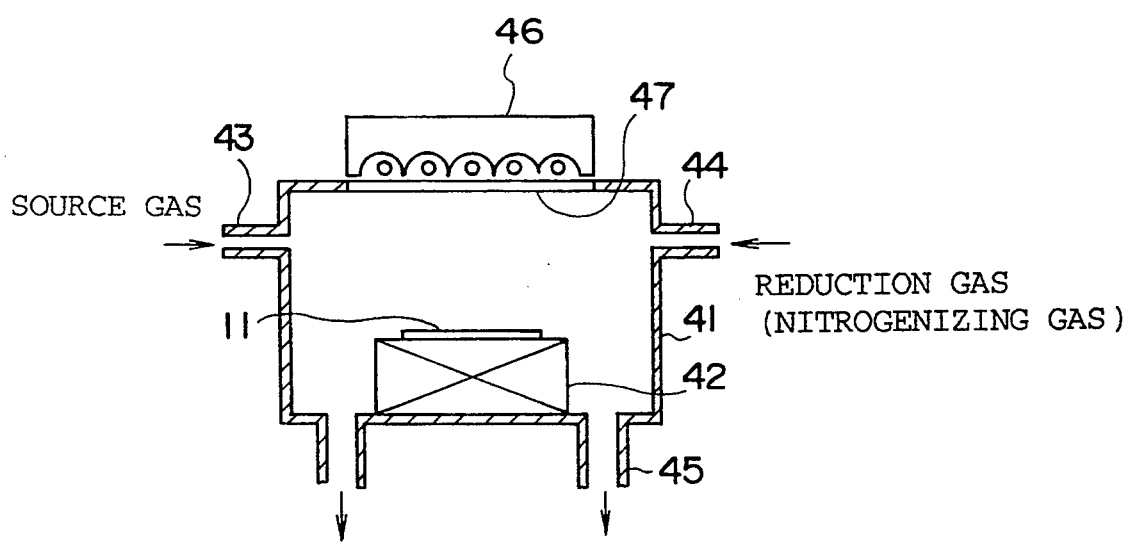
FIG. 7 is a general configuration of a photo-assisted CVD apparatus to be used in an embodiment of the present invention.
Figure 8A:
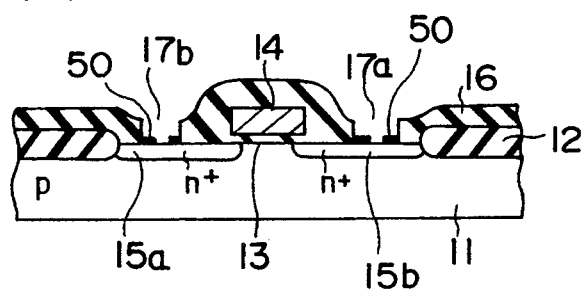
FIGS. 8(A), 8(B), 8(C), 8(D), 8(E) and 8(F) are respectively a cross sectional view showing variation modes of a stacking structure of a semiconductor device where a barrier metal and a contact metal according to the fourth and fifth embodiments of the present invention are formed.
Figure 8B:
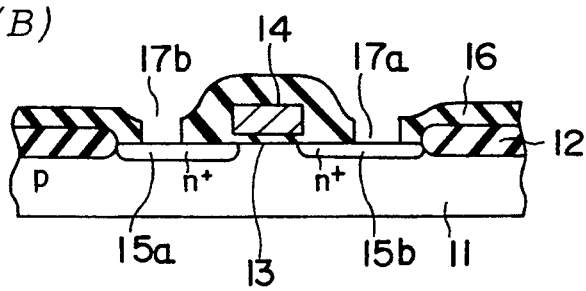
Figure 8C:
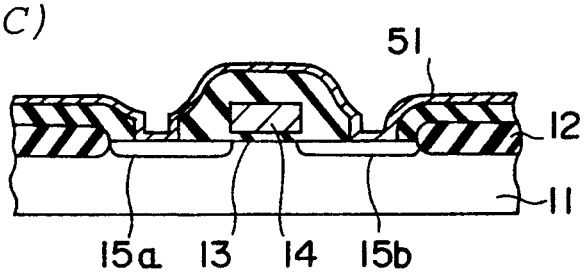
Figure 8D:
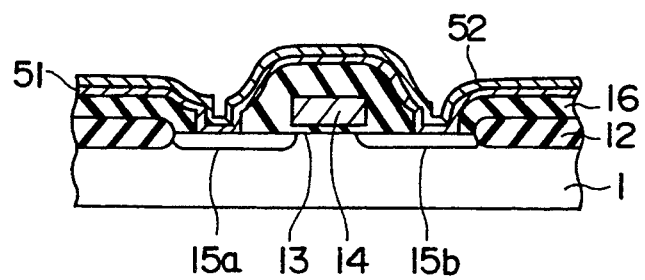
Figure 8E:
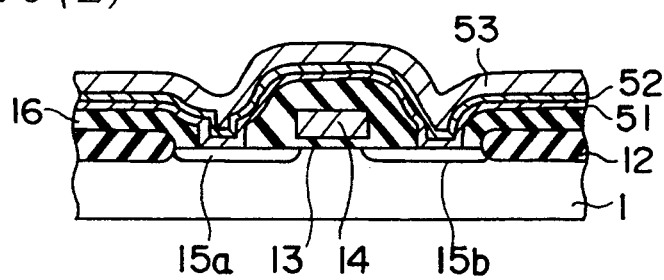
Figure 8F:
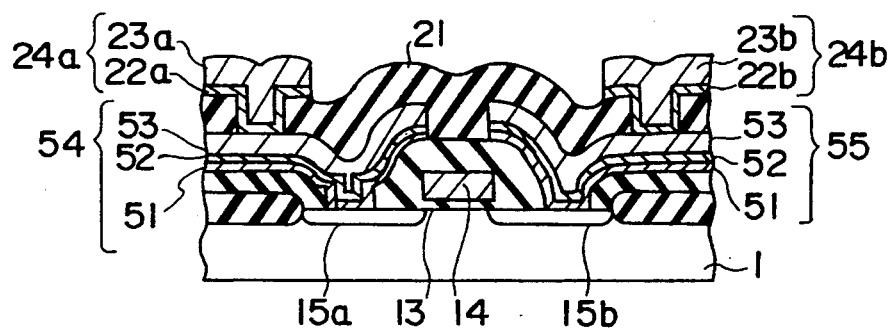

FIG. 7 is a general configuration of the CVD apparatus for forming the titanium nitride film in accordance with the third embodiment of the present invention.

FIG. 7 differs from FIG. 1 in that a mercury lamp for irradiating the ultraviolet ray is used as means for activating the reduction gas.

The chamber 41 of the CVD apparatus is internally provided with a stand 42 incorporating a heater for resting a semiconductor substrate on which deposition of films is carried out, a gas inlet 43 for introducing a source gas into the chamber 41, a gas inlet 44 for introducing a reductive gas into the chamber 41, a gas outlet 45 connected to a gas discharging unit, not shown, for discharging the gas in the chamber 41, a mercury lamp 46 for irradiating the ultraviolet ray in the chamber 41 to activate the reductive gas, and a penetration window 47 which is formed on the wall of the chamber 41 to penetrate the ultraviolet ray from the mercury lamp 45.

In this CVD apparatus, the reductive gas and the source gas in the chamber 41 are activated by a high energy ultraviolet ray generated from the mercury lamp when the mercury lamp is turned on. The substrate heating temperature of 500° C. or under is sufficient for deposition owing to irradiation of the ultraviolet ray.

As a source gas containing a refractory metallic element to be introduced into the chamber 41, a gas containing an alkyl amino compound, alkoxide, halide or cyclopentadienyl compound of a refractory metal is used as in the first embodiment, and a gas containing an alkyl amino compound, a gas containing an alkyl azide compound or a gas containing a hydrazine or a hydrazine alkyl compound is used as the reduction agent for reducing the source gas as in the first embodiment of the present invention. Thus a refractory metal nitride which serves as a barrier metal is formed on the semiconductor substrate.

In this case, only alkyl compounds, N2 and H2 which remain gaseous at room temperature are produced as reactive products in addition to refractory metal nitrides and do not remain on the internal wall of the chamber 41.

Since the above described source gas and reduction gas are used and the source gas and the reductive gas are activated by a high energy ultraviolet ray, a substrate heating temperature of 300° C.–500° C. is sufficient to form a barrier metal consisting of titanium nitride and, in case of a interconnection layer being provided below the electrode, a thermal effect on the lower interconnection layer is further reduced and electrode hillock is also restrained.

As regards the deposition rate, resistivity, chlorine concentration and step coverage, similar results to the first embodiment are obtained and titanium nitride is most suited as a barrier metal material for the interconnection of the semiconductor device.

(4) Fourth Embodiment

FIG. 8 is a cross sectional view showing the manufacturing processes for the semiconductor devices in accordance with the fourth embodiment of the present invention.

In this embodiment, the CVD apparatus shown in FIG. 1 which is used in the first embodiment is also used and the description of the CVD apparatus is omitted.

Part of the cross section of the semiconductor substrate before titanium nitride is formed as a barrier metal is as shown in FIG. 8 (A). A field oxide film 12 is formed by the selective oxidation method on a portion which surrounds an element forming area on the upper surface of the semiconductor substrate 11 made of p type silicon, a gate insulation film 13, gate electrode 14 and S/D area layers 15a and 15b of the MOSFET are formed on the element forming area, and contact holes 17a and 17b for exposing the S/D area layers 15a and 15b are formed on the interlevel insulator 16 which covers them.

The natural oxide film (SiO2) 50 is deposited on the surfaces of S/D area layers 15a and 15b which are exposed from the contact holes 17a and 17b.

Under this condition, the semiconductor substrate 11 is placed on the stand 2 in the chamber 1 of the CVD apparatus as shown in FIG. 1. After this, the pretreatment process for forming a contact metal is started.

After the gas pressure in the chamber 1 is reduced to $1 \times 10^{-4}$ Torr, the semiconductor substrate 11 is heated by the heater built in the stand 2 to raise the temperature of the substrate, which is usually maintained at room temperature, to 400°–700° C.

Then, when hydrazine (N2H4) gas is introduced at the flow rate of 100 sccm into the chamber 1 through the gas inlet 4 and the surface of semiconductor substrate 11 is exposed to N2H4, the natural oxide film (SiO2) 50 of approximately 10Å in thickness which is formed on the surfaces of S/D area layers 15a and 15b exposed from contact holes 17a and 17b are removed as shown in FIG. 8 (B).

The natural oxide film 50 on the substrate is also removed in the case that the substrate temperature is set 400° C. and a hydrazine alkyl compound, for example, methyl hydrazine (MH) is supplied instead of N2H4 at the flow rate of 100 sccm for 60 seconds.

It is assumed that such removal of the natural oxide film 50 results from reduction of SiO2 with active hydrogen radical dissociated from N2H4.

Next, a process for depositing TiSi as a contact metal is started.

The semiconductor substrate 11 is heated to 400°–700° C., and TiCl4 gas, MH gas and Si2H6 gas are introduced into the chamber 1 respectively at flow rates of 10 sccm, 5 sccm, and 200 sccm and the internal pressure of the chamber 1 is set to several tens mTorr.

Under this condition, TiSix is deposited at the deposition rate of approximately 100Å/min. The TiSix film 51 is formed, as shown in FIG. 8 (C), in a thickness of 100 Å along the upper surfaces of S/D area layers 15a and 15b, internal peripheries of contact holes 17a and 17b and the upper surface of the interlevel insulator 16. In this case, the TiSix film 51 contains nitrogen of a few ppm.

Polysilane gases such as SiH4 and Si3H8 may be used in addition to Si2H6.

A process for depositing titanium nitride as a barrier metal for the interconnection is started.

The semiconductor substrate 11 is heated to 400°–500° C., and TICl4, MH are introduced into the chamber 1 respectively at 10 sccm and 10 sccm. Additionally, NH3 gas can be used as carrier gas of MH and its flow-rate is 100 sccm. In this case, the internal pressure of the chamber 1 shall be 100 mTorr.

Under this condition, as shown in FIG. 8 (D), a titanium nitride film 52 having resistivity of 100 $\mu\Omega$.cm or less is formed on S/D area layers 15a and 15b, internal peripheries of contact holes 17a and 17b and interlevel insulator 16.

The concentration of chlorine remaining in the titanium nitride film 52 was reduced to 1/40 as compared with deposition for which NH3 is used as the reduction agent. If chlorine concentration is high, it is dissolved into water to be used for cleaning to cause corrosion of the aluminium film stacked on the barrier metal. If the chlorine concentration is substantially lowered as in case of this embodiment, there will be rarely a possibility of corrosion.

After such barrier metal has been stacked, the semiconductor substrate 11 is taken out from the CVD apparatus and an aluminium film 53 is stacked in a thickness of approximately 5000Å by the sputtering method as shown in FIG. 8 (E).

Then, the layers from aluminium film 53 to the contact metal 51 are patterned by the photolithography technology to form the S/D electrodes 54 and 55. After this, an interlevel insulator 21 is stacked by the CVD method. Subsequently, as shown in FIG. 8 (F), upper side interconnections 24a and 24b which are made of titanium nitride/aluminium are formed. The description of these interconnections has been already given and is therefore omitted.

The reduction gas can be a hydrazine alkyl compound or N2H4 other than MH.

In the above described configuration, the processes from removal of the natural oxide film 50 to formation of the titanium nitride film 52 serving as the barrier metal are carried out in the chamber 1 of the same CVD apparatus without cancelling the vacuum condition and therefore the natural oxide film will not grow again and the throughput will be improved. A series of processes up to formation of the contact metal after removal of the natural oxide film are carried out at a low temperature under 600° C. using hydrazine or a hydrazine alkyl compound and accordingly a thermal strain which may occur between layers is reduced.

If titanium of titanium nitride serving as the barrier metal accounts for 60% or over, the titanium nitride film containing a rich amount of titanium is formed on the interfaces of the silicon surfaces of S/D area layers 15a and 15b and the titanium nitride film 52. By annealing for 10 seconds at a temperature of 450° C. or over, for example, at 600° C. without forming the contact metal, a TiSix layer is formed on the interface. Accordingly, polysilane need not be supplied to form the contact metal.

Source gas and reduction gas as described in the first embodiment can be used as a reaction gas.

As regards the deposition rate, resistivity, chlorine concentration and step coverage in this embodiment, similar results to the first embodiment are obtained and a metal nitride obtained is most suited as material of a barrier metal for the interconnection of the semiconductor device.

(5) Fifth Embodiment

Figure 9:
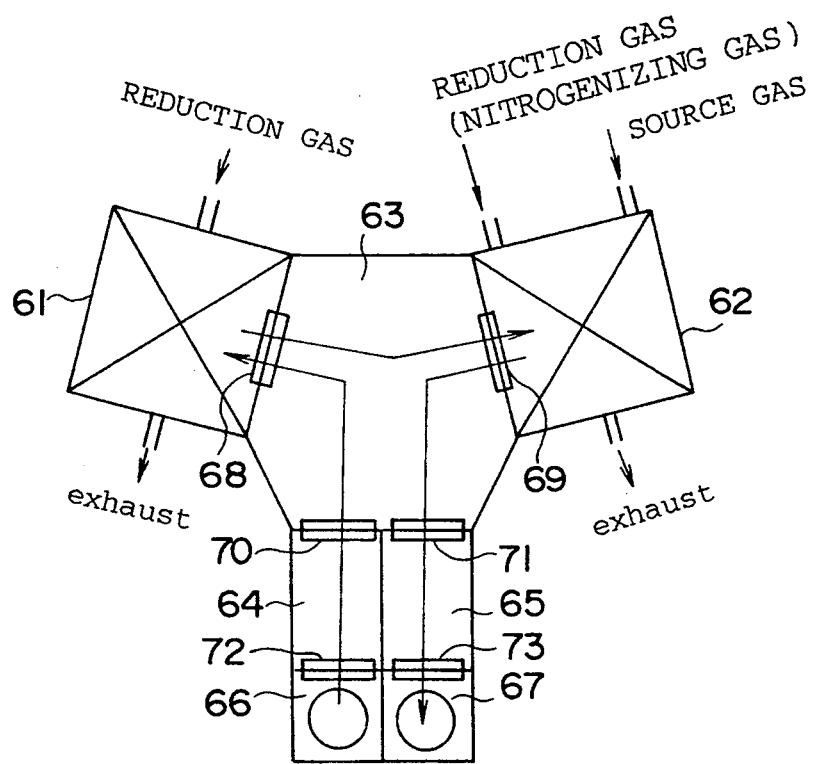
FIG. 9 is a general configuration of an apparatus to be used in the processes from removal of a natural oxide film to formation of a barrier metal film according to the fifth embodiment of the present invention.

In the fourth embodiment, the processes from removal of the natural oxide film to formation of the barrier metal are carried out in the same reaction chamber. However the removal of the natural oxide film and the formation of the barrier metal can be individually carried out in different chambers. An example of the apparatus is shown in FIG. 9.

This apparatus has two reaction chambers 61 and 62 and a vacuum transfer chamber 63 for transferring a semiconductor substrate in a pressure-reduced atmosphere is provided between these reaction chambers 61 and 62. A load chamber 64 and an unload chamber 65 for loading and unloading the semiconductor substrates are connected to the vacuum transfer chamber 63 and cassette stations 66 and 67 are connected to these load chamber and the unload chamber.

Gate valves 67–73 are respectively connected between reaction chambers 61,62 and the vacuum transfer chamber 63, between the vacuum transfer chamber 63 and the load chamber 64, between the vacuum transfer chamber 63 and the unload chamber 65, between the load chamber 64 and the first cassette station 66, and between the unload chamber 65 and the second cassette station 67. These gate valves 67–73 are opened and closed along with movement of the semiconductor substrate and these opening and closing operations is omitted from the following description.

The following describes the processes from removal of the natural oxide film to formation of the barrier metal by means of the above described apparatus. In this embodiment, the conditions for deposition such as a type of gas and deposition temperature and the deposition film thickness shall be the same as those in the fourth embodiment, and a variation of the stacking structure on the semiconductor substrate is as shown in FIG. 8.

The semiconductor substrate 11 taken out of the first cassette station 66 by the transfer system not shown is transferred to the load chamber 64 and placed in the pressure-reduced atmosphere, then set in the first reaction chamber 61 through the vacuum transfer chamber 63. The vacuum transfer chamber 63 and the reaction chamber 61 maintain a pressure-reduced condition.

In the first reaction chamber 61, hydrazine or a hydrazine alkyl compound is introduced, the internal pressure is set to 100 mTorr and the substrate heating temperature is set to 400°–700° C.

When this condition is held for a specified period of time, natural oxide films (SiO2) 50 formed on the silicon surfaces of S/D area layers 15a and 15b as shown in FIG. 8 (A) are removed.

Then the semiconductor substrate 11 is taken out of the first reaction chamber 61 by the transfer system not shown and transferred to the second reaction chamber 62 through the vacuum transfer chamber 63.

In the second reaction chamber 62, TICl4, MH and Si2H6 are introduced and the substrate heating temperature is set to 400°–700° C. as in the fourth embodiment. The TiSix film 51 as a contact metal is formed along the internal peripheries of contact holes 17a and 17b, the surfaces of S/D area layers 15a and 15b and the upper surface of the interlevel insulator 16 as shown in FIG. 8 (C).

The types of gases to be introduced into the second reaction chamber 62 are changed and TiCl4 and MH are introduced into the reaction chamber 62 and the semiconductor substrate 11 is heated to 400°–500° C. Then the titanium nitride film 52 as a barrier metal is deposited as shown in FIG. 8 (D).

After this, the semiconductor substrate 11 is transferred from the second reaction chamber 62 to the vacuum transfer chamber 63 by the transfer system not shown and further transferred from the vacuum transfer chamber 63 to the unload chamber 65 where the internal pressure is reduced. In addition, after the gate valve 73 between the unload chamber 65 and the vacuum transfer chamber 63 is closed, the internal pressure of the unload chamber 65 is set to the regular pressure and the semiconductor substrate 11 is stored in the second cassette station 67.

After this, as in the fourth embodiment, an aluminium film 53 is stacked on the barrier metal film 52 by the sputtering method as shown in FIG. 8 (E) and the layers from the aluminium film 53 to the contact metal film 51 are patterned to form the S/D electrodes 54 and 55 as shown in FIG. 8 (F) by the lithography technology.

Also in this embodiment, If the titanium content of titanium nitride film 52 is determined to 60% or over and annealing is carried out at a temperature of 450° C. or over, a TiSi film is formed between the silicon surfaces of S/D area layers 15a and 15b and the titanium nitride film 52 without using Si2H6.

The source gas and the reduction gas to be used in this embodiment can be as same as for the first embodiment and similar results to the first embodiment are obtained with respect to the deposition rate, resistivity, chlorine concentration and step coverage.

What is claimed is:

1. A method for deposition of a refractory metal nitride, wherein a refractory metal nitride is deposited in a vapor phase by using a source gas containing a refractory metal and a reducing and nitrogenizing gas containing at least one of an alkyl amino compound, an alkyl azide compound, hydrazine and a hydrazine alkyl compound for reducing and nitrogenizing said source gas.

2. A method for deposition of a refractory metal nitride in accordance with claim 1, wherein said refractory metal nitride is one of titanium nitride, tungsten nitride and molybdenum nitride.

3. A method for deposition of a refractory metal nitride in accordance with claim 1, wherein said reducing and nitrogenizing gas additionally contains ammonia.

4. A method for deposition of a refractory metal nitride in accordance with claim 1, wherein said source gas contains one of a halide of a refractory metal, an alkyl amino compound of a refractory metal, art alkoxide of a refractory metal and a cyclopentadienyl compound of a refractory metal.

5. A method for deposition of a refractory metal nitride in accordance with claim 1, wherein the content of the refractory metal in said refractory metal nitride is at least 60 atomic %.

6. A method for forming a conductive film which has a refractory metal nitride layer, said method comprising:
    (a) depositing a refractory metal nitride film containing at least 60 atomic % of a refractory metal on an upper surface of a silicon layer by a chemical vapor deposition method, the refractory metal nitride film being deposited by using a reduction gas containing at least one of an alkyl amino compound, hydrazine and a hydrazine alkyl compound;
    (b) forming a refractory metal silicide layer between said refractory metal nitride film and said silicon layer by heating said refractory metal nitride film at a temperature of at least 450° C.; and
    (c) forming a conductive film which provides a lower resistance than that of said refractory metal nitride film on said refractory metal nitride film.

7. A method for forming a conductive film which has a refractory metal nitride layer in accordance with claim 6, wherein said refractory metal nitride film is one of a titanium nitride film, a tungsten nitride film and a molybdenum nitride film.

8. A method for forming a conductive film which has a refractory metal nitride layer in accordance with claim 6, further comprising:
    before step (a), maintaining said silicon layer in a pressure-reduced atmosphere; and
    before step (a), removing a natural oxide film from the surface of said silicon layer through a thermal chemical reaction by introducing a reduction gas containing at least one of hydrazine and a hydrazine alkyl compound onto the surface of said silicon layer maintained in the pressure-reduced atmosphere.

9. A method for forming a conductive film which has a refractory metal nitride layer in accordance with claim 8, wherein maintaining said silicon layer in a pressure-reduced atmosphere, removing a natural oxide film and step (a) are carried out in a pressure-reduced atmosphere.

10. A method for forming a conductive film having a refractory metal nitride layer, said method comprising:
    (a) forming a refractory metal silicide layer according to a vapor deposition method by supplying a mixed gas containing one of hydrazine gas, a hydrazine alkyl compound gas and an alkyl amino compound gas, a gas containing a refractory metallic element and a polysilane gas onto a silicon layer;
    (b) forming a refractory metal nitride film according to a vapor deposition method by supplying a mixed gas containing one of hydrazine gas, a hydrazine alkyl compound gas and an alkyl amino compound gas, and a gas containing a refractory metallic element onto said refractory metal silicide layer; and
    (c) forming a conductive film having a lower resistance than that of said refractory metal nitride film on said refractory metal nitride film.

11. A method for forming a conductive film having a refractory metal nitride layer in accordance with claim 10, wherein said refractory metal nitride film is one of a titanium nitride film, a tungsten nitride film and a molybdenum nitride film.

12. A method for forming a conductive film having a refractory metal nitride layer in accordance with claim 10, further comprising:
    before step (a), maintaining said silicon layer in a pressure-reduced atmosphere; and
    before step (a), removing a natural oxide film from the surface of said silicon layer through a thermal chemical reaction by introducing a reduction gas containing at least one of hydrazine and a hydrazine alkyl compound onto the surface of said silicon layer maintained in the pressure-reduced atmosphere.

13. A method for forming a conductive film having a refractory metal nitride layer in accordance with claim 12, wherein maintaining said silicon layer in a pressure-reduced atmosphere, removing a natural oxide film and step (a) are carried out in a pressure-reduced atmosphere.

14. A method for forming a conductive film having a refractory metal nitride layer in accordance with claim 10, wherein the gas containing said refractory metallic element is one of a halide of a refractory metal, an alkyl amino compound of a refractory metal, an alkoxide of a refractory metal and a cyclopentadienyl compound of a refractory metal.

* * * * *

UNITED STATES PATENT AND TRADEMARK OFFICE
CERTIFICATE OF CORRECTION

PATENT NO. : 5,393,565
DATED : February 28, 1995
INVENTOR(S) : T. Suzuki et al

It is certified that error appears in the above-indentified patent and that said Letters Patent is hereby corrected as shown below:

```
Title page : [75] after "Kawasaki" insert -- -shi --

[73] after "Kawasaki" insert -- -shi --

[56] Other Publications, line 8, delete "p.1-7".
```

Col. 13, CLAIM 1, lines 5-6, delete "an alkyl azide compound,".

Col. 13, CLAIM 4, line 4, delete "art" and insert --an--.

Signed and Sealed this

Thirteenth Day of June, 1995

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,393,565
DATED : February 28, 1995
INVENTOR(S) : T. Suzuki et al.

It is certified that error appears in the above-indentified patent and that said Letters Patent is hereby corrected as shown below:

On the Title page, item [73] Assignee:  Please add --Tokyo Electron Limited, Tokyo, Japan--.

Signed and Sealed this

Eleventh Day of June, 1996

Attest:

BRUCE LEHMAN

Attesting Officer      Commissioner of Patents and Trademarks